(12) United States Patent
Lenssens et al.

(10) Patent No.: US 12,124,171 B2
(45) Date of Patent: Oct. 22, 2024

(54) APPARATUS AND METHOD FOR EXPOSURE OF RELIEF PRECURSORS

(71) Applicant: XSYS Prepress N.V., Ypres (BE)

(72) Inventors: Pieter Lenssens, Zottegem (BE); Frederik Defour, Boezinge (BE)

(73) Assignee: XSYS PREPRESS N.V., Ypres (BE)

( * ) Notice: Subject to any disclaimer, the term of this patent is extended or adjusted under 35 U.S.C. 154(b) by 0 days.

(21) Appl. No.: 17/626,849

(22) PCT Filed: Jul. 14, 2020

(86) PCT No.: PCT/EP2020/069837
§ 371 (c)(1),
(2) Date: Jan. 13, 2022

(87) PCT Pub. No.: WO2021/013627
PCT Pub. Date: Jan. 28, 2021

(65) Prior Publication Data
US 2022/0276568 A1  Sep. 1, 2022

(30) Foreign Application Priority Data

Jul. 19, 2019  (NL) ...................................... 2023537

(51) Int. Cl.
*G03F 7/20* (2006.01)
*G03F 7/00* (2006.01)

(52) U.S. Cl.
CPC .......... *G03F 7/70558* (2013.01); *G03F 7/201* (2013.01); *G03F 7/7005* (2013.01); *G03F 7/70891* (2013.01)

(58) Field of Classification Search
CPC .... G03F 7/70558; G03F 7/7005; G03F 7/201; G03F 7/2051; G03F 7/70391; G03F 7/20;
(Continued)

(56) References Cited

U.S. PATENT DOCUMENTS

2001/0017690 A1* 8/2001 Vernackt ................ H04N 1/047
355/26
2003/0129533 A1 7/2003 Goodin
(Continued)

FOREIGN PATENT DOCUMENTS

JP 2005208559 A 8/2005
JP 2007284594 A 11/2007
(Continued)

OTHER PUBLICATIONS

English translation of KR-2012041977-A, published May 3, 2012. (Year: 2012).*
(Continued)

*Primary Examiner* — Christina A Riddle
(74) *Attorney, Agent, or Firm* — KDW Firm PLLC

(57) ABSTRACT

An apparatus for exposure of a relief precursor (P) which comprises a substrate layer and at least one photosensitive layer. The apparatus includes a carrying structure for carrying a relief precursor and an LED array configured to illuminate a photosensitive layer of the relief precursor carried by the carrying structure. The LED array is configured to illuminate simultaneously a predetermined surface area of at least 900 cm$^2$. The LED array includes a plurality of subsets of one or more LEDs, each subset being individually controllable. The apparatus also includes a control unit to control the plurality of subsets individually, and such that an irradiation intensity difference in the predetermined surface area is within a predetermined range.

16 Claims, 7 Drawing Sheets

(58) Field of Classification Search
CPC .... G03F 7/2002; G03F 7/2004; G03F 7/2022; G03F 7/203; G03F 7/2032; G03F 7/2055; G03F 7/2063; G03F 7/213; G03F 7/70; G03F 7/70008; G03F 7/7025; G03F 7/70275; G03F 7/70375; G03F 7/70383; G03F 7/70425; G03F 7/7045; G03F 7/70466; G03F 7/70483; G03F 7/70491; G03F 7/70508; G03F 7/70516; G03F 7/70525; G03F 7/70533; G03F 7/7055; G03F 7/7085; G03F 7/70691; G03F 7/70758; G03F 7/70791; G03F 7/708; G03F 7/70808; G03F 7/70825; G03F 7/70858; G03F 7/70883–70891; G03F 7/705; G03F 7/70605–706851
USPC ........ 355/18, 23, 24, 26, 30, 32, 35, 37, 46, 355/52–55, 67–77, 133; 250/492.1; 430/5, 22, 30
See application file for complete search history.

(56) References Cited

U.S. PATENT DOCUMENTS

| | | | | |
|---|---|---|---|---|
| 2010/0045954 | A1* | 2/2010 | Onvlee | G03F 7/70116 355/77 |
| 2010/0267174 | A1* | 10/2010 | Moffatt | H01L 21/67115 257/E21.135 |
| 2014/0313493 | A1 | 10/2014 | Struewe et al. | |
| 2014/0315132 | A1* | 10/2014 | Struewe | G03F 7/2008 355/30 |
| 2018/0173103 | A1* | 6/2018 | Nagahara | H01L 21/6715 |
| 2018/0210345 | A1 | 7/2018 | Wolterink et al. | |

FOREIGN PATENT DOCUMENTS

| | | | | |
|---|---|---|---|---|
| JP | 2015111265 A | | 6/2015 | |
| JP | 2017528763 A | | 9/2017 | |
| JP | 2018101042 A | | 6/2018 | |
| JP | 2018533081 A | | 11/2018 | |
| KR | 2012041977 A | * | 5/2012 | ........... G03F 7/2002 |
| WO | WO-2004009318 A1 | * | 1/2004 | ......... B29C 35/0288 |
| WO | 2016030450 A1 | | 3/2016 | |
| WO | 2017072588 A2 | | 5/2017 | |
| WO | WO-2022069767 A1 | * | 4/2022 | ........... G03F 7/2004 |

OTHER PUBLICATIONS

International Search Report and Written Opinion for the International Patent Application No. PCT/EP2020/069837, mailed Nov. 6, 2020, 11 pages.

* cited by examiner

APPARATUS AND METHOD FOR EXPOSURE OF RELIEF PRECURSORS

This application is a national stage filing under 35 U.S.C. 371 of pending International Application No. PCT/EP2020/069837, filed Jul. 14, 2020, which claims priority to Netherlands patent application serial number 2023537, filed Jul. 19, 2019, the entirety of which applications are incorporated by reference herein.

FIELD OF INVENTION

The field of the invention relates to apparatus and methods for exposure of relief precursors, in particular printing plate precursors, and more in particular for backside exposure of printing plate precursors.

BACKGROUND

Relief structures can be made by transfer of image information onto an imageable layer and removing parts of the imageable layer. The formed relief may then be used to transfer the information in a printing step onto a substrate. An example of a relief precursor is a printing plate precursor. Digitally imageable flexible printing plate precursors are known, and typically comprise at least a dimensionally stable support layer, a photopolymerizable layer and a digitally imageable layer. The digitally imageable layer may be e.g. a laser-ablatable layer. In case of conventional printing plate precursors, the digitally imageable layer is replaced by a mask which is attached to a photopolymerizable layer.

To produce a printing plate from a printing plate relief precursor, according to existing methods, first a mask is written into the digitally imageable layer based on image data to be printed. Following the writing of the mask, the plate is exposed through the mask with radiation such that the photopolymerizable layer undergoes polymerization in the regions which are not covered by the mask. Following the exposure, the residues of the mask and of the non-polymerized portions have to be removed. This may be done with one or more liquids in a washer apparatus.

Exposure apparatus for printing plate precursors are known. An exposure apparatus may comprise an irradiation means for front exposure and an irradiation means for back exposure. Back exposure is typically done using a set of UV light tubes. The back exposure creates a solid layer (floor) onto which the relief structures are generated. Front exposure may also be done using a set of UV light tubes or may be done using a movable UV light source, such as a movable laser or a LED bar. Some exposure apparatus only do front exposure or only do back exposure, depending on the requirements. In some cases the exposure apparatus is capable to expose from both sides wherein either the plate is turned over, or one side is exposed through a transparent support. When UV tubes are used, the entire precursor is exposed at the same time and this is often called flood exposure. An important feature for this type of exposure is the homogeneity of the light output over the whole exposure area. The intensity output of a UV tube is rather homogeneous along its axis and by dense packing of the tubes the homogeneity is sufficient to produce printing plates.

LEDs are used due to their high energy output, narrow emission spectrum and low energy consumption. Due to the high intensity of the LEDs, in existing solutions, the LEDs are mounted in a linear fashion into a so-called LED bar which spans the width of a printing plate. The bar is then moved across the plate whereby the movement resulted in a homogenization of the light output in scanning direction. Attempts to use LEDs for flood exposure failed so far due to the different intensity output of the single LEDs. To increase the homogeneity, relative motion between LED array and the substrate was applied (see e.g. WO2016160301A1), or the intensity distribution was altered with optics and/or mirrors (see e.g. WO2017192499A1). These methods are complex, error-prone and expensive.

US 2018/0210345 A1 discloses a method and apparatus to expose photosensitive printing plates with a predetermined radiation density from the main side (top) and a predetermined radiation density from the back side (bottom). The method comprises executing the main exposure with a time delay after the back exposure. The time delay between back exposure and main exposure is optimized to create smaller stable single dot elements on the photosensitive printing plate after processing and smaller single element dot sizes printed on the print substrate. The plate floor may be adjusted by performing a back-side-only exposure prior to executing the combined back and main exposure with the time delay.

SUMMARY

The object of embodiments of the invention is to provide apparatus and methods for exposure of relief precursors allowing an improved control of the area to be exposed when using LEDs.

According to a first aspect of the invention there is provided an apparatus for exposure of a relief precursor (P) which comprises a substrate layer and at least one photosensitive layer. The apparatus comprises a carrying structure for carrying a relief precursor, a LED array and a control unit. The LED array is configured to illuminate a photosensitive layer of the relief precursor carried by the carrying structure, preferably through the substrate layer of the relief precursor. The LED array is configured to illuminate simultaneously a predetermined surface area of at least 900 $cm^2$, preferably at least 1000 $cm^2$, more preferably at least 2000 $cm^2$, most preferably at least 5000 $cm^2$. The LED array comprises a plurality of subsets of one or more LEDs, each subset being individually controllable. The control unit is configured to control the plurality of subsets individually, and such that an irradiation intensity variation in the predetermined surface area is within a predetermined range.

By using a LED array with individually controllable subsets of LEDs, the irradiation intensity of the subsets can be adjusted to obtain a more or less homogeneous illumination of the surface area to be illuminated. In that manner a floor with a substantially constant thickness can be achieved. Further, when a LED fails, by having a control unit configured to individually control the subsets, the subsets may be controlled to compensate for the failing LEDs, so that the homogeneity is not significantly influenced, whilst the failing LED may not need to be replaced.

Also, by having a LED array which covers a large area, the apparatus may be designed such that the relief precursor can be submitted to a back or front exposure in a single step by activating the LED array. It is noted that an apparatus may be designed for the largest relief precursors, and that when smaller relief precursors have to be exposed, e.g. back-exposed, only a portion of the LEDs of the LED array may be activated. Although the apparatus is preferably intended for back-exposure through a transparent substrate layer of the relief precursor, embodiments of the invention also cover apparatus where the LED array is used for direct front exposure without the light passing through the relief precursor and the carrying structure.

By performing the controlling such that an irradiation intensity variation in the predetermined surface area is within a certain range, it can be achieved that the thickness variation of the floor is accurately controlled.

Further, compared to existing solutions for back exposure using e.g. UV light tubes, the energy consumption and the cost of embodiments of the invention can be lower by using a LED array. Also, the process can be faster since there is no need for pre-heating, as for UV light tubes. Also, because the subsets of the LED array can be individually activated in function of the size of the relief precursor, the energy consumption for smaller plates will be smaller compared to existing solutions where all the UV light tubes are activated regardless of the size.

The irradiation intensity in a point of the predetermined surface area may be a light intensity measured in this point at one moment in time and expressed in W/cm2. Preferably, the irradiation intensity is a UV light intensity measured in a predetermined wavelength range, e.g. using a sensor as described below. When the irradiation intensity variation in the predetermined surface area is within a predetermined range, this means that the difference between any two points of the predetermined surface area is within a predetermined range.

The predetermined surface area is a surface area at a distance of the LED array, parallel to the plane of the LED array. Preferably, the distance between the LED array and the predetermined surface area is at least 35 mm. The dimensions of the predetermined surface area are roughly the same dimensions as the LED array. However, if only a portion of the LEDs of the LED array are used, the shape and dimensions of the predetermined surface area will roughly correspond to the shape and dimension of the portion of the LED array which is used. The relief precursor to be exposed may be arranged such that the predetermined surface area is located in the relief precursor, and in particular in the at least one photosensitive layer, but the predetermined surface area may also be located at a small distance of the relief precursor, as the irradiation intensity variation will be more or less the same for a number of parallel surface areas within a certain distance range of the LED array.

Preferably, the condition that the irradiation intensity variation in the predetermined surface area is within the predetermined range is valid for any surface area parallel to the plane of the LED array, which is at a distance of the LED array between a first distance (d1) and a second distance (d2), wherein the difference between the second and the first distance (d2−d1) is at least 1 mm, more preferably at least 2 mm, even more preferably at least 5 mm and most preferably 7 mm.

Preferably, each subset of the plurality of subsets of one or more LEDs comprises at least four LEDs, more preferably a LED array of at least two rows and at least two columns Preferably each subset comprises less than seventeen LEDs, more preferably less than thirteen LEDs, even more preferably less than then LEDs. For example, each subset may comprise an array of 2×2 LEDs connected in series, so that the intensity delivered by the four LEDs together is controlled. By keeping the subset relative small and by using arrays of LEDs a good homogeneity can be obtained. In a possible embodiment, the distance between two adjacent LEDs of a same subset is smaller than a distance between two adjacent LEDs from different subsets.

Preferably, the control unit is configured to control the plurality of subsets such that an irradiation intensity difference in the predetermined surface area is less than 10% from a nominal value, preferably less than 5%, more preferably less than 4%, most preferably less than 1.5%.

By performing the controlling such that an irradiation intensity difference in the predetermined surface area is less than 10%, it can be achieved that the thickness variation of the floor of the exposed and developed relief precursor is less than 10%, more preferably less than 4%, most preferably less than 1.5% of the average floor thickness.

According to a second aspect of the invention there is provided an apparatus for exposure of a relief precursor which comprises at least one photosensitive layer. The apparatus comprises a carrying structure for carrying a relief precursor, an LED array, at least one sensor, and a control unit. The LED array is configured to illuminate a photosensitive layer of the relief precursor carried by the carrying structure. The LED array comprises a plurality of subsets of one or more LEDs, each subset being individually controllable. The at least one sensor is configured to measure in a plurality of locations of a surface area irradiated by the LED array, a value representative for the irradiation intensity. The control unit is configured to control the plurality of subsets individually based on the values measured by the at least one sensor.

By using one or more sensors to measure the irradiation intensity, the subsets can be controlled in an improved manner to obtain a predetermined irradiation pattern, typically a homogeneous irradiation pattern. For example, when the at least one sensor detects that one of the LEDs is broken, the driving of the neighboring LEDs may be controlled to compensate for the broken LED. Also, for example, the LEDs may age in a different manner, and this difference in aging may be compensated for based on the values measured by the at least one sensor.

The at least one sensor is configured to measure as a value representative for the irradiation intensity. This value may be e.g. a UV light intensity (in mW/cm2) and/or a total amount of UV radiation, i.e. a radiation dose (in mJ/cm2), during a predetermined exposure period. Optionally, the at least one sensor may configured to measure a 3D distribution covering a plurality of parallel predetermined surface areas. In addition or alternatively, the at least one sensor may be mounted such that a distance between the LED array and the at least one sensor is adjustable.

In a preferred embodiment, the LED array and the carrying structure are fixed, such that the relief precursor does not move relative to the LED array during exposure by the LED array.

In a preferred embodiment, each subset consists of one, two, three, four or five LED(s). By keeping the subsets sufficiently small an accurate control of the homogeneity can be achieved. The one or more LEDs of a subset may be the same or different.

In a preferred embodiment, the LED array is configured to expose the relief precursor through a substrate layer thereof. However, in other embodiments, the apparatus may be used for direct front exposure without the light passing through the relief precursor or carrying structure.

Preferably, the apparatus further comprises a moving means configured to move the at least one sensor in order to perform measurements in the plurality of locations. The moving means may comprise for example belts, rails, lead screws, creep dive, linear motors, etc.

Preferably, the moving means comprises a drive configured to move the at least one sensor in a surface parallel to relief precursor carried by the carrying structure.

Preferably, the control unit is configured to control the LEDs based on the measurement values by the at least one sensor in the plurality of locations, so that the difference in irradiation intensity in the plurality of locations is within a predetermined range.

The plurality of locations may be arranged along a grid which may be chosen independently of the position of the LEDs. Alternatively, a correlation may exist between the position of the LEDs and the plurality of locations. Preferably, the number of the plurality of locations is equal to or higher than the number of the plurality of subsets. For example, each subset may comprise one LED, and the sensor measurements may be performed for each LED. However, depending on the pattern according to which the LEDs are arranged, the number of locations may also be less than the number of the plurality of subsets.

According to an exemplary embodiment, the control unit is configured to associate one or more LEDs with a location of the plurality of locations. Typically, one or more LEDs in the neighborhood of the measurement location will influence the measured irradiation intensity, and the control unit, using the associations between the plurality of locations and the LEDs of the LED array, will be able to adjust the irradiation intensity of the LEDs that require adjustment to achieve a desired illumination. For example, three or more LEDs may be closest to a location of the plurality of locations, and those three or more LEDs may be associated with that location. The controller may be capable to adjust the irradiation intensity of a LED in the neighborhood of a first location to be similar to the irradiation intensity measured in another location. Also, the controller may be capable to adjust the irradiation intensity of the LEDs such that the irradiation intensity in the plurality of locations is similar to a value measured in a first location.

According to an exemplary embodiment, the controller is configured to control the subsets such that the irradiation intensity difference between the plurality of locations is less than 10%, preferably less than 5%, more preferably less than 4%, most preferably less than 1.5%.

According to an exemplary embodiment, the at least one sensor comprises a camera, a light sensor, a sensor sensitive to temperature, or a combination thereof. Such sensors may include, for example, photodiodes, including avalanche photodiodes, phototransistors, photoconductive detectors, linear sensor arrays, CCD detectors, CMOS optical detectors (including CMOS array detectors), photomultipliers, and photomultiplier arrays. According to certain embodiments, a sensor, such as a photodiode or photomultiplier, may contain additional signal conditioning or processing electronics. For example, a sensor may include at least one pre-amplifier, electronic filter, or integrating circuit. Suitable pre-amplifiers include integrating, trans-impedance, and current gain (current mirror) pre-amplifiers.

Preferably, the apparatus further comprises a distance adjustment means configured to adjust the distance between the carrying structure and the LED array. It is noted that the LED array may be moved and/or the carrying structure.

Using such adjusting means, the homogeneity of the illumination in a desired plane can be further improved. For example, depending on the thickness of a transparent layer of the relief precursor, the distance between the carrying structure and the LED array may be adjusted.

Preferably, the LEDs of the LED array are configured to emit electromagnetic radiation with a wavelength in the region of 200 to 2000 nm, more preferably from 250 to 500 nm, even more preferably from 300 to 450 nm, most preferably from 270 to 410 nm, e.g. mainly at 365 nm. The at least one sensor may then be sensitive a corresponding wavelength region, e.g. from 200 nm to 2000 nm.

Preferably, the irradiation intensity delivered by the LEDs in a predetermined surface area is in the range of 0.1 to 2000 mW/cm$^2$. For back exposure, preferably the irradiation intensity delivered by the LEDs in a predetermined surface area is between 5 and 100 mW/cm$^2$, more preferably between 8 and 60 mW/cm$^2$, most preferably between 10 and 50 mW/cm$^2$. For front exposure, preferably the irradiation intensity delivered by the LEDs in a predetermined surface area is between 30 and 500 mW/cm$^2$, more preferably between 50 and 450 mW/cm$^2$, most preferably higher than 100 mW/cm$^2$. Preferably, the distance between the LED array and the predetermined surface area is at least 35 mm. The predetermined surface area may be a surface area in the relief precursor when mounted on/in the carrying structure or at a small distance of the relief precursor.

Preferably, the dose of radiation delivered by the LEDs in the predetermined surface area is in the range of 0.01 to 200 J/cm$^2$. For back exposure, preferably dose delivered by the LEDs in the predetermined surface area is in the range of 0.1 to 100 J/cm$^2$, more preferably 0.5 to 50 J/cm$^2$, most preferably 0.5 to 30 J/cm$^2$. For front exposure, preferably dose delivered by the LEDs in the predetermined surface area is higher than 10 J/cm$^2$, more preferably higher than 20 J/cm$^2$.

The LED array may be arranged on one or more carriers such as PCBs. For example, the LED array may be composed of sets of smaller arrays arranged on multiple LED PCBs arranged next to each other in the same plane. The driver circuitry for driving the LED array may be arranged on one or more separate driver PCBs. The one or more driver PCBs may be arranged in a plane parallel to and at a distance of the plane in which the multiple LED PCBs are arranged. When the relief precursor faces a first side of the multiple LED PCBs, then the one or more driver PCBs may face the other side of the multiple LED PCBs.

Preferably, the distance between individual LEDs of the LED array is at least 5 mm, more preferably at least 7 mm, and preferably smaller than 100 mm, more preferably smaller than 30 mm. Such distances allow obtaining a sufficiently homogeneous irradiation intensity in a predetermined plane parallel to the plane in which the LED array is arranged.

Preferably, the apparatus further comprises a cooling means configured to cool the LED array. The cooling means may be e.g. a cooling means configured to generate a gas flow, typically an air flow. Additionally or alternatively cooling means with liquid coolant may be used.

Preferably, the apparatus further comprises a drive means configured for driving the LED array, preferably by pulse width modulation (PWM) signals. As explained above, the drive means may comprise driver circuitry arranged on one or more separate driver PCBs, and the one or more driver PCBs may be arranged in a plane parallel to and at a distance of the plane in which the multiple LED PCBs are arranged. More in particular, the control unit may be configured to vary the duty cycle of the PWM signals in order to change the irradiation intensity generated a subset of one or more LEDs. The drive means may drive the subsets using a current or a voltage.

Preferably, the carrying structure comprises a support structure on which the relief precursor can be supported and the support structure is at least partially transparent for the light generated by the LED array.

Preferably the carrying structure comprises any one of the following: a glass plate, a polymer plate, a mesh, a set of rollers, a drum, a structure configured for hanging the relief precursor, a structure configured for tensioning the relief precursor.

In an exemplary embodiment the apparatus may comprise a housing with an entrance and exit, and optionally the relief precursor may be automatically fed through the entrance to a position on the carrying structure, illuminated, and next removed from the apparatus through the exit. In other words, embodiments of the invention allow building a fully automated in-line system.

The entrance and the exit may be at the same side or at opposite sides. The entrance and exit may be configured to be connected to other units.

The apparatus may comprise a transport system for automatic transport of the relief precursor through the apparatus.

The transport system may comprise a transport means selected from the group comprising an endless belt, a pair of chains or belts (with pushing blocks), a pair of lead screws, a creep drive, a friction drive, and combinations thereof.

The transport system may further comprise at least one attachment means to attach the relief precursor to the transport means. The attachment means may be a transport bar with a plurality of pins extending through an edge of the relief precursor. Alternatively a clamping means for clamping the relief precursor may be used. The transport bar may be configured to be coupled to a leading edge of the relief precursor, wherein the transport system is configured to pull the transport bar with the coupled relief precursor through the housing. When the transport system comprises two lead screws, the end portions of the transport bar may be provided with dents adapted to be coupled to the lead screws.

Additional components may be part of the apparatus. Such additional components may be selected form the group comprising a power source, an additional light source for front exposure, an additional transport means, motors, sensors, and combinations thereof. The additional light source may be selected from the group comprising an LED, a fluorescent lamp, a flash lamp, a set of light tubes arranged in a linear fashion, a (scanning) laser, an LCD screen, a projection system (e.g. with movable mirrors), lasers and combinations thereof (these may be stationary and/or movable).

In a possible embodiment, the additional light source may be a further LED array, preferably a further LED array as defined above. In other words, the invention covers embodiments where a LED array as defined above is used for back exposure, embodiments where a LED array as defined above is used for front exposure, and embodiments where a first LED array as defined above is used for back exposure and a second LED array as defined above is used for front exposure.

In a preferred embodiment, back exposure is performed simultaneously with front exposure. For example, back exposure may be performed using a LED array according to any one of the embodiments disclosed above, and front exposure may be performed using a LED array or other suitable light source at the same time as the back exposure, i.e. a same spot of the relief precursor may be exposed both from the back and from the front.

Optionally, the control unit controls components of the apparatus as well as components of other units in a process chain. In that manner the various operations that need to be performed on the relief precursor may be coordinated by single control unit. It is noted that the control unit may also be a distributed control means with a number of control modules performing controlling in an independent or dependent way.

The control unit may also be configured to control the timing of the front and back exposure such that back exposure is performed using a LED array according to any one of the embodiments disclosed above, and front exposure is performed using a LED array or other suitable light source at the same time as the back exposure, i.e. a same spot of the relief precursor may be exposed both from the back and from the front.

According to an exemplary embodiment, the irradiated surface area is divided into at least two areas which are irradiated with a different irradiation intensity and wherein preferably the irradiation intensity difference at different positions within each area is less than 10%, preferably less than 5%, more preferably less than 4%, most preferably less than 1.5%; or wherein the thickness difference of the floor of the exposed and developed relief precursor is less than 10%, preferably less than 5%, more preferably less than 4%, most preferably less than 1.5% of floor thickness.

By dividing the irradiated surface area into at least two areas, a different irradiation intensity can be used in those areas such that at least two floors with a different thickness can be obtained.

According to another aspect of the invention, there is provided a method for exposure of a relief precursor which comprises a substrate layer, preferably a transparent substrate layer, and at least one photosensitive layer. The method comprises the steps of: using a LED array, optionally a LED array of an apparatus according to any one of the previous embodiments, to emit radiation to a photosensitive layer of the relief precursor, preferably through the substrate layer of the relief precursor, such that a predetermined surface area of the photosensitive layer of at least 900 cm$^2$ is radiated simultaneously, said LED array comprising a plurality of subsets of one or more LEDs, each subset being individually controllable; controlling the plurality of subsets individually, and such that an irradiation intensity variation in the predetermined surface area is within a predetermined range, and preferably such that an irradiation intensity difference is less than 10%, preferably less than 5%, more preferably less than 4%, most preferably less than 1.5%.

According to another aspect of the invention, there is provided a calibration method for calibrating an exposure apparatus comprising a LED array, e.g. an exposure apparatus according to any one of the embodiments above. The method comprises the steps of: using the LED array to emit radiation in a predetermined surface area; said LED array comprising a plurality of subsets of one or more LEDs, each subset being individually controllable; measuring in a plurality of locations of the predetermined surface area, a value representative for the irradiation intensity; determining a control scheme for controlling the plurality of subsets based on the values measured by the at least one sensor to obtain a desired irradiation pattern in the predetermined surface area.

The calibration method may be repeated from time to time, and is capable of compensating for aging or failing LEDs of the LED array. Preferably, the irradiation intensity settings for the individual LEDs are saved and/or applied for exposure of further relief precursors, wherein preferably a large number of relief precursors are exposed before performing again the calibration procedure.

Preferably, the desired irradiation pattern is a substantially homogeneous irradiation pattern.

Preferably, the measuring in a plurality of locations is done by moving at least one sensor such that the at least one sensor performs measurements in the plurality of locations.

The plurality of locations may be chosen as explained above in connection with another aspect of the invention.

In an exemplary embodiment, the measuring and controlling comprises the steps of:
1. positioning at least one sensor at a first position in a plane parallel to the plane of LED array, said first position being associated with one or more first neighboring LEDs of the LED array;
2. measuring the irradiation at a first location associated with the first position of the at least one sensor;
3. positioning the at least one sensor at a further position in said plane, said further position being associated with one or more further neighboring LEDs of the LED array;
4. measuring the irradiation intensity at a further location associated with the further position of the at least one sensor;
5. adjusting the irradiation of one or more of the first and/or further neighboring LEDs such that the difference between irradiation intensity in the first location and in the further location is reduced;
6. wherein optionally the steps above are repeated for the same and/or for other locations.

Optionally, the irradiated area may be overlaid with a grid wherein the distance of the grid lines is equal to or larger than the smallest distance between the LEDs of the LED array and the at least one sensor may be positioned at the intersections of the grid lines.

Preferably, the first and further positions of the at least one sensor are chosen such that at least one neighbor LED of the first position is a neighbor LED of the further position.

According to an exemplary embodiment, the measured radiation values in the plurality of locations are collected and stored and an algorithm is used to adjust the intensities of the individual LEDs to a target value, such that the difference between the different locations is lower than 10% of the irradiation intensity at the first position, preferably less than 5%, more preferably less than 4%, most preferably less than 1.5%.

The invention further relates to a method for exposure of a relief precursor which comprises a substrate layer and at least one photosensitive layer, said method comprising the calibration method of any one of the embodiments above, and the step of irradiating a photosensitive layer of the relief precursor with the desired irradiation pattern using the determined control scheme.

According to another aspect of the invention, there is provided a calibration method for calibrating an exposure apparatus comprising a LED array, e.g. an exposure apparatus according to any one of the embodiments above. The method comprises the steps of: using the LED array to emit radiation in a predetermined area of a photosensitive layer of the relief precursor, such that said predetermined are cures; said LED array comprising a plurality of subsets of one or more LEDs, each subset being individually controllable; removing the uncured portion of the relief precursor; measuring thickness variations of the cured area; determining a control scheme for controlling the plurality of subsets based on the measured thickness variations to obtain a desired irradiation pattern in the predetermined area.

The calibration procedure may be repeated from time to time, and is capable of compensating for aging or failing LEDs of the LED array. Preferably, the irradiation intensity settings for the individual LEDs are saved and/or applied for exposure of further relief precursors.

The removing of the uncured portion of the relief precursor may be done by a solvent or by thermal development.

Optionally the irradiated area may be overlaid with a grid wherein the distance of the grid lines is equal to or larger than the smallest distance between the LEDs and the thickness may be measured at the intersections of the grid lines. The positions of thickness measurements may be chosen such that at least one neighbor LED associated with a first position is also a neighbor LED of a further position.

According to an exemplary embodiment, the measured thickness values are collected and stored and an algorithm is used to adjust the intensities of the individual LEDs to a target value, such that in future relief precursors the difference between the different thicknesses is lower than 10% of the thickness at a first position, preferably less than 5%, more preferably less than 4%, most preferably less than 1.5%.

The invention further relates to a method for exposure of a relief precursor which comprises a substrate layer and at least one photosensitive layer, said method comprising the calibration method of any one of the embodiments above, and the step of irradiating a photosensitive layer of a further relief precursor with the desired irradiation pattern using the determined control scheme.

According to a further aspect of the invention, there is provided a method for exposing a relief precursor comprising the following steps:
a) providing an apparatus according to any one of the embodiments described above,
b) performing a calibration procedure according to any one of the embodiments described above,
c) providing a relief precursor comprising a substrate layer and at least one photosensitive layer,
d) optionally performing a pre-exposure with an additional light source,
e) optionally positioning of the relief precursor on an at least partially transparent support,
f) performing an exposure of the relief precursor with the intensity settings obtained in step b),
g) optionally performing an exposure with an additional light source,
h) optional further steps.

Step b) may be performed after step c), d), or e).

Step f) may be performed through the substrate layer of the relief precursor. Step f) and step g) may be performed simultaneously or consecutively. Step f) may be a back exposure and step g) a front exposure or vice versa.

The pre-exposure of step d) may be performed using a light source selected from the group comprising an LED, a fluorescent lamp, a flash lamp, a set of light tubes arranged in a linear fashion, a (scanning) laser, an LCD screen, a light projection system (e.g. with movable mirrors), and combinations thereof. During the pre-exposure step the transmission of a layer of the relief precursor is altered in an image forming fashion (includes ablation and transmission change).

The optional further steps of step h) may be selected from the group of removal of uncured material, washing, drying, heating, post-exposure, grinding, and combinations thereof.

According to a further aspect of the invention, there is provided a method for exposing a relief precursor comprising the following steps:
a) providing a relief precursor with a substrate layer and at least one photosensitive layer, b) exposing the relief precursor with homogeneous radiation emitted by an array of LEDs through the substrate layer, c) optional further steps whereby in step b) no mask or imaging means is used and wherein the irradiation intensity difference at different locations in the relief precursor is less than 10%.

Any of the features described above may be combined with this method where possible.

Preferably, the homogenized irradiation intensity is in the range of 0.1 to 2000 mW/cm$^2$.

Preferably, the radiation dose delivered in step b) is in the range of 0.01 to 200 J/cm$^2$.

Optionally, a pre-exposure may be performed before step b) using a light source selected from the group comprising an LED, a fluorescent lamp, a flash lamp, a set of light tubes arranged in a linear fashion, a (scanning) laser, an LCD screen, a light projection system (e.g. with movable mirrors), and combinations thereof. Optionally, further steps may be performed, e.g. steps selected from the group of removal of uncured material, removal of uncured material, washing, drying, heating, post exposure, grinding, and combinations thereof.

The relief precursor may be a precursor for an element selected from the group comprising: a flexographic printing plate, a relief printing plate, a letter press plate, an intaglio plate, a (flexible) printed circuit board, an electronic element, a microfluidic element, a micro reactor, a phoretic cell, a photonic crystal and an optical element, a Fresnel lens.

BRIEF DESCRIPTION OF THE FIGURES

The accompanying drawings are used to illustrate presently preferred non limiting exemplary embodiments of the apparatus and method of the present invention. The above and other advantages of the features and objects of the invention will become more apparent and the invention will be better understood from the following detailed description when read in conjunction with the accompanying drawings, in which.

DETAILED DESCRIPTION OF EMBODIMENTS

Figure 1:
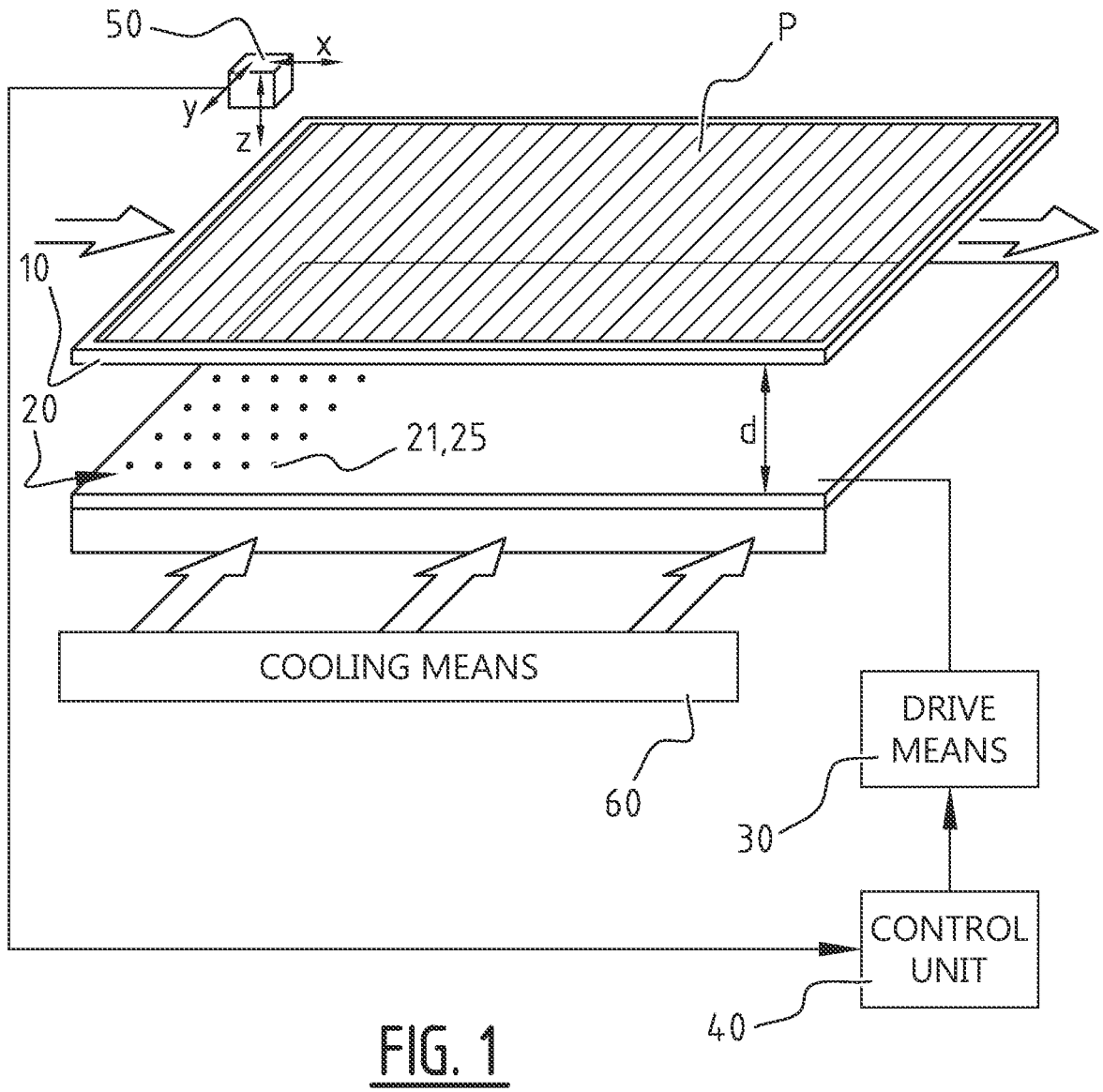
FIG. 1 is a schematic perspective view of the an exemplary embodiment of an apparatus for exposure of a relief precursor.
Figure 1A:
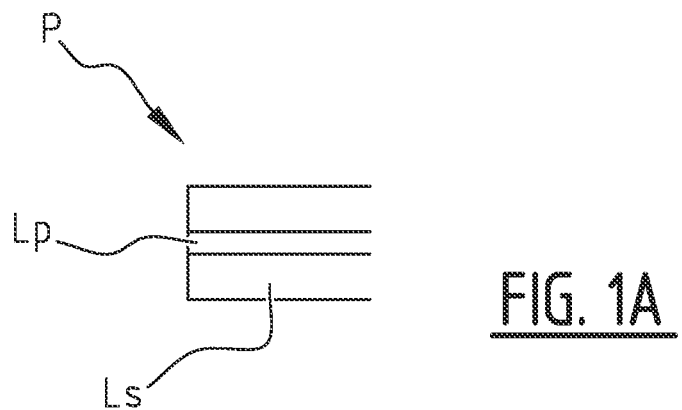
FIG. 1A is a cross section of the relief precursor.

FIG. 1 illustrates schematically an apparatus for exposure of a relief precursor P. The relief precursor P is shown in cross section in FIG. 1A and comprises a substrate layer Ls, here a substrate layer transparent for the irradiation of the LEDs, see further, and at least one photosensitive layer Lp. The apparatus comprises a carrying structure 10 for carrying a relief precursor P, a LED array 20, a drive means 30 for driving the LED array 20, a control unit 40 for controlling the drive means 30, and at least one sensor 50. The LED array 20 is configured to illuminate a photosensitive layer Lp of the relief precursor P carried by the carrying structure 10.

The carrying structure 10 provides for a horizontal support of the relief precursor, and may be e.g. a transparent plate. However, in other embodiments the carrying structure 10 could be configured for providing an inclined support or for hanging the relief precursor vertically or for tensioning the relief precursor such that the relief precursor extends in a plane. The carrying structure 10 is arranged such that a relief precursor carried by the carrying structure extends substantially parallel to a plane in which the LED array 20 is arranged.

Figure 1B:
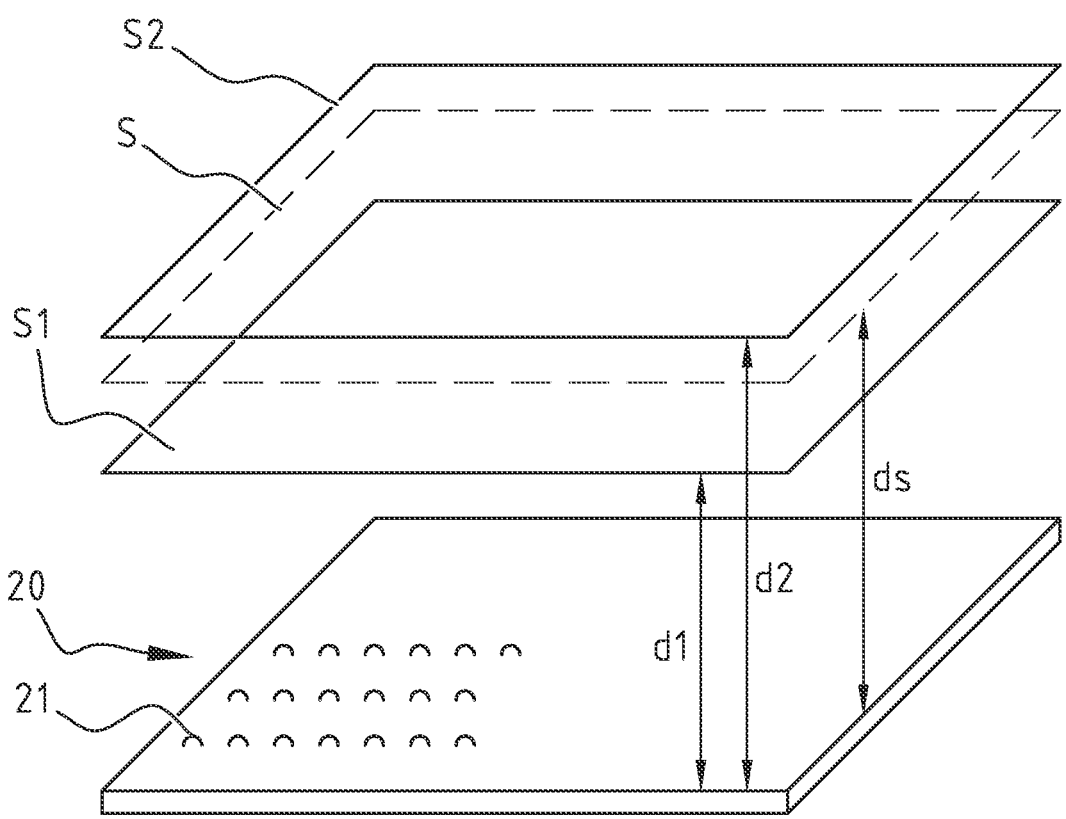
FIG. 1B is a view of the LED array illustrating the position of a predetermined surface area at a distance of the LED array.
Figure 2A:
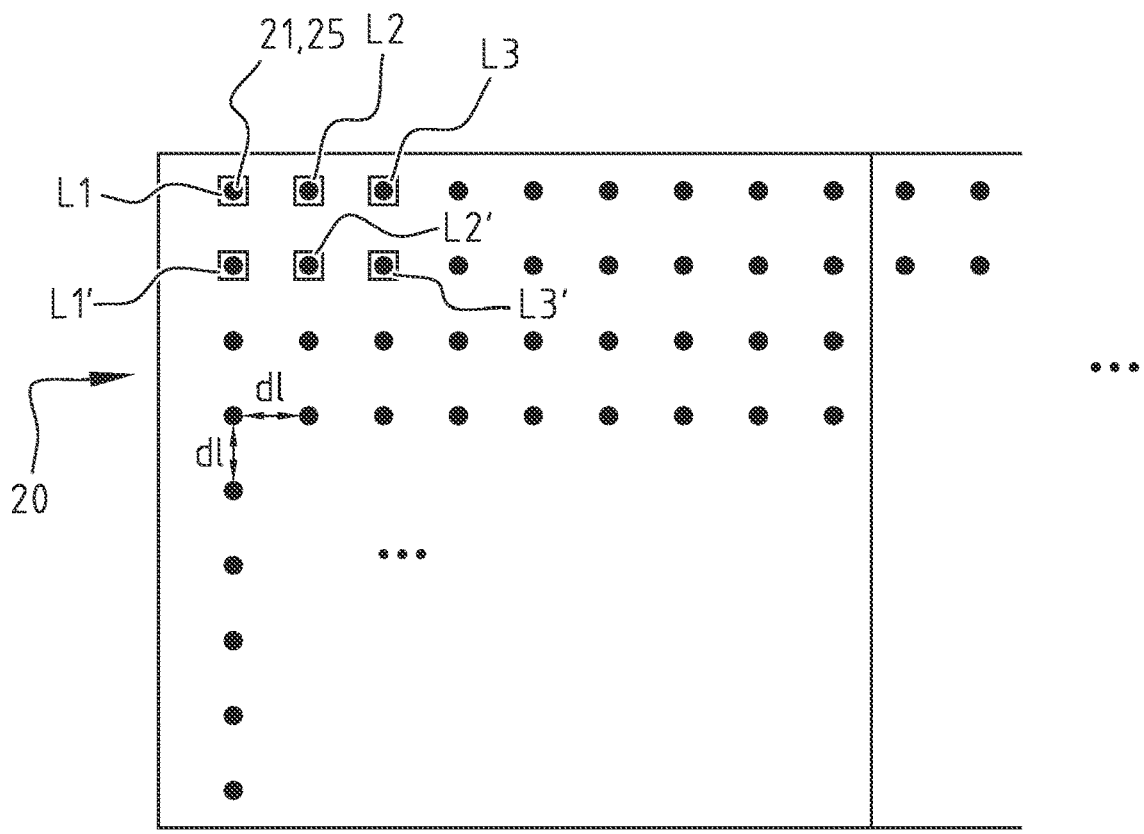
FIG. 2A is a top view of an exemplary embodiment of a LED array.
Figure 2B:
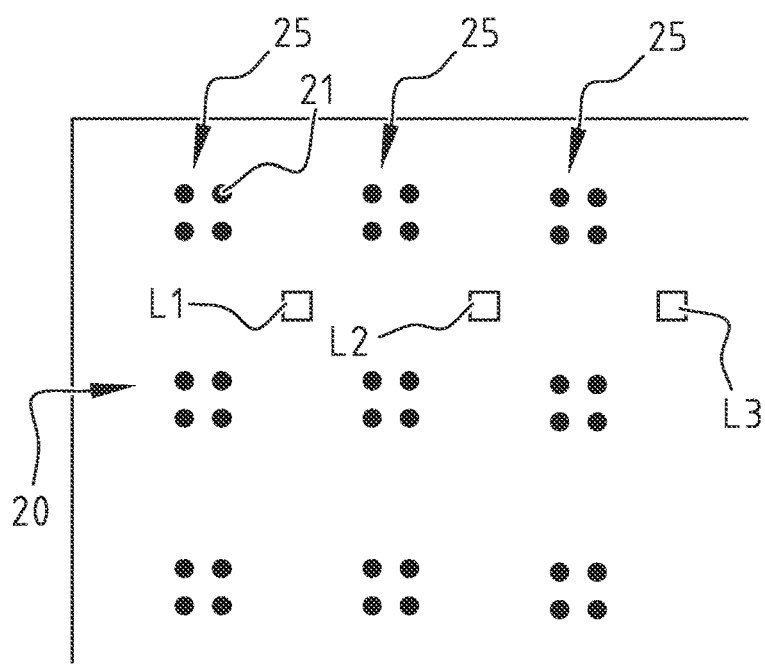
FIG. 2B is a top view of another exemplary embodiment of a LED array.
Figure 3:
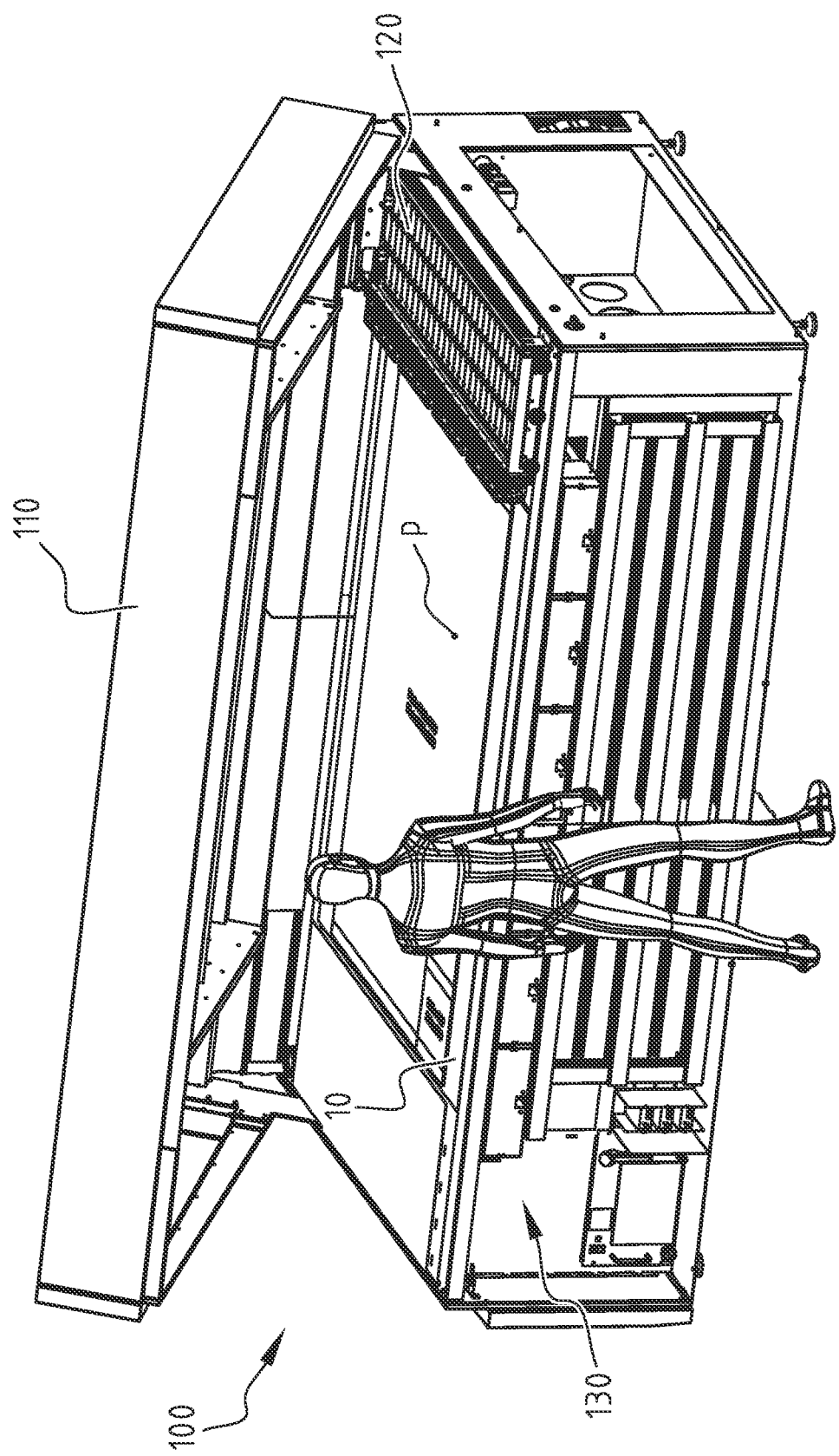
FIG. 3 is a perspective view of the an exemplary embodiment of an apparatus for exposure of a relief precursor.

The LED array 20 is configured to illuminate simultaneously a predetermined surface area S of at least 900 cm2, see also FIG. 1B. The LED array 20 comprises a plurality of subsets 25 of one or more LEDs 21, each subset 25 being individually controllable in the sense that the irradiation intensity delivered by a first subset 25 can be controlled independently of the intensity of another subset 25. In the exemplary embodiment of FIGS. 1 and 2A, each subset 25 comprises one LED 21 which is individually controllable. However, as illustrated in FIG. 2B, a number of LEDs 21 may be grouped in subset 25, e.g. a number of LEDs 21 connected in series, wherein the subset 25 is individually controllable. In the example of FIG. 2B, each subset 25 comprises four LEDs 21, and the intensity delivered by the four LEDs together can be controlled.

Figure 7A:
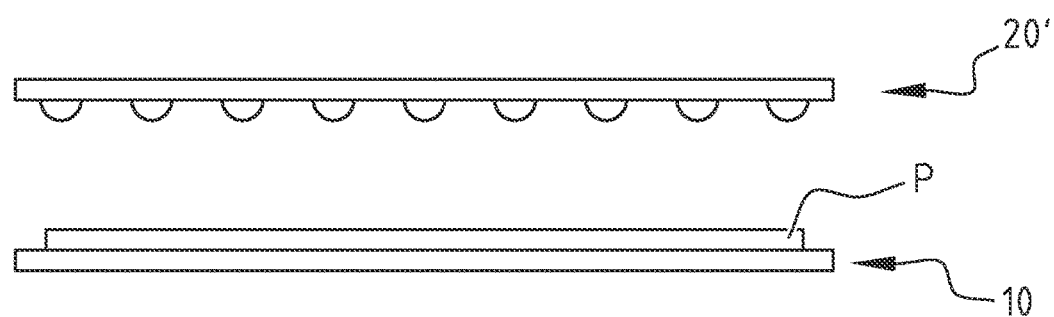
FIGS. 7A and 7B illustrate in a schematic cross section two further exemplary embodiments of the invention.
Figure 7B:
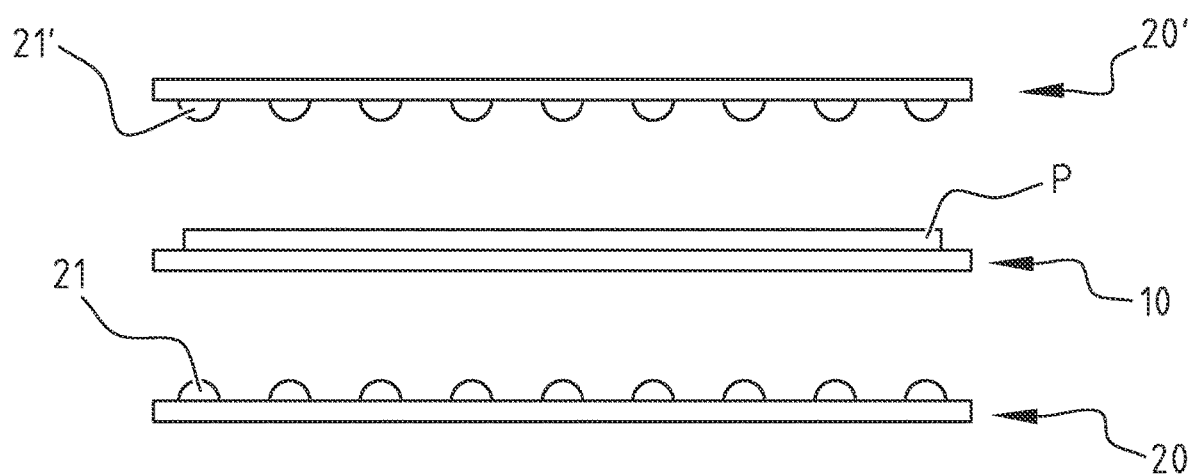

The LED array 20 is arranged to illuminate the photosensitive layer Lp of the relief precursor P through the substrate layer Ls of the relief precursor P, i.e. the apparatus is intended for back-exposure. However, as shown in the schematic view of FIG. 7A, it is also possible to implement a LED array 20' with LEDs 21' for front-exposure or, as shown in FIG. 7B, to implement two LEDs arrays 20, 20' for front- and back-exposure. The LEDs 21 may be arranged on one or more LED PCBs.

The control unit 40 is configured to control the plurality of subsets 25 individually, and such that an irradiation intensity variation in the predetermined surface area is within a predetermined range. The predetermined surface area may correspond e.g. with a support plane of the relief precursor or with a plane at a small distance above said support plane. Ideally the predetermined surface area corresponds with a plane in which the photosensitive layer Lp to be irradiated is located.

The LED array 20 with individually controllable subsets 25 of LEDs 21 allows to adjust the irradiation intensity of the subsets 21 to obtain a controlled irradiation, and in particular more or less homogeneous illumination of the predetermined surface area S to be illuminated. In that manner, a floor with a controlled thickness, and in particular a floor with a substantially constant thickness, can be achieved. Further, when a LED 21 fails, by having a control unit 40 configured to individually control the subsets 21, the subsets 21 may be controlled to compensate for the failing LED, so that the homogeneity is not significantly influenced.

As illustrated in FIG. 1B, the predetermined surface area S is a surface area at a distance of the LED array 20, parallel to the plane of the LED array. Preferably, the distance ds between the LED array 20 and the predetermined surface area S is at least 35 mm. The dimensions of the predetermined surface area S are roughly the same dimensions as the LED array 20. However, if only a portion of the LEDs 21 of the LED array 20 are used, the shape and dimensions of the predetermined surface area S will roughly correspond to the shape and dimension of the portion of the LED array 20 which is used. The relief precursor P to be exposed may be arranged such that the predetermined surface area S is located in the relief precursor P, and in particular in the at least one photosensitive layer Lp, but the predetermined surface area may also be located at a small distance of the relive precursor, as the irradiation intensity variation will be more or less the same for a number of parallel surface areas within a certain distance range of the LED array. Preferably, the condition that the irradiation intensity variation in the predetermined surface area S is within the predetermined range is valid for any surface area parallel to the plane of the LED array 20, which is at a distance of the LED array between a first distance d1 and a second distance d2, wherein the difference between the second and the first distance (d2−d1) is at least 1 mm, more preferably at least 2, even more preferably at least 5 mm and most preferably 7 mm. This is illustrated in FIG. 1B, for all surface areas S between S1 and S2, the condition is valid. In that manner, the condition can be easily fulfilled in the entire layer Lp to be cured.

The at least one sensor 50 is configured to measure in a plurality of locations L1, L2, L3, L1', L2', L3', etc. (see FIG. 2A) of a surface area irradiated by the LED array 20, a value representative for the irradiation intensity in said plurality of locations L1, L2, L3, L1', L2', L3'. This surface area may be the same as the above mentioned predetermined surface area or may be located in another plane parallel to the plane of the LED array 20. The control unit 40 may then be configured to control the plurality of subsets 25 individually based on the values measured by the at least one sensor. The plurality of locations may correspond to positions above the plurality of LEDs 21 as illustrated in FIG. 2A but the measurements may also be done in other locations L1, L2, L3 as illustrated in FIG. 2B. More generally, any pattern of locations which allows to obtain a representative image of the irradiation in a relevant surface area can be used. The apparatus comprises a moving means (not shown) configured to move the at least one sensor 50 in a plane parallel to the LED array 20, in an X-direction and in an Y-direction, in order to perform measurements in the plurality of locations. The moving means may comprise a drive configured to move the at least one sensor 50 in a plane parallel to the relief precursor P carried by the carrying structure 10. The plane in which the at least one sensor 50 moves may be a plane of the relief precursor P, a plane at a distance above said relief precursor P, or at a distance below said relief precursor P. Optionally, the at least one sensor 50 may configured to measure a 3D distribution covering a plurality of parallel predetermined surface areas S between S1 and S2. In addition or alternatively, the at least one sensor 50 may be mounted such that a distance in the Z-direction between the LED array 20 and the at least one sensor 50 is adjustable.

The control unit 40 may be configured to control the LEDs 21 based on the measurement values by the at least one sensor 50 in the plurality of locations, so that the difference in irradiation intensity in the plurality of locations is within a predetermined range, when it is desirable to obtain a substantially homogeneous irradiation and thus a substantially constant layer thickness of the polymerized photosensitive layer Lp.

Optionally, the apparatus further comprises a distance adjustment means (not shown) configured to adjust the distance d between the carrying structure 10 and the LED array 20. In that manner the distance d can be optimized so that the irradiation is maximal in the area to be exposed.

Preferably, the LEDs 21 of the LED array 20 are configured to emit electromagnetic radiation with a wavelength in the region from 270 to 410 nm. Preferably, the LEDs 21 emit UV light. Preferably, the irradiation intensity delivered by the LEDs in the predetermined surface area is in the range of 1 to 200 mW/cm2, and/or the dose of radiation delivered by the LEDs 21 is between 1 and 100 J/cm2. The distance d1 between individual LEDs 21 of the LED array 20, see FIG. 2A, may be at least 5 mm, preferably at least 7 mm, and preferably smaller than 100 mm.

The apparatus further comprises cooling means 60 configured to cool the LED array 20. The cooling means 60 may be configured to send an air flow underneath the LED array 20, and in particular underneath the one or more LED PCBs on which the LEDs 21 are mounted.

The drive means 30 is configured for driving the LED array 20, preferably by pulse width modulation signals. The drive means 30 may comprise one or more driver PCBs onto which the driver circuitry is mounted. The driver PCBs may be positioned in a plane parallel to the LED PCBs, underneath the LED PCBs.

By using a LED array with individually controllable subsets of LEDs, the irradiation intensity of the subsets can be adjusted to obtain a more or less homogeneous illumination of the surface area to be illuminated. In that manner a floor with a substantially constant thickness can be achieved. Further, when a LED fails, by having a control unit configured to individually control the subsets, the subsets may be controlled to compensate for the failing LEDs, so that the homogeneity is not significantly influenced, whilst the failing LED may not need to be replaced.

Also, by having a LED array which covers a large area, the apparatus may be designed such that the relief precursor can be submitted to a back exposure in a single step by activating the LED array. It is noted that an apparatus may be designed for the largest relief precursors, and that when smaller relief precursors have to be exposed, e.g. back-exposed, only a portion of the LEDs (sufficient to cover the size of the smaller plate) of the LED array may be activated. Although the apparatus is preferably intended for back-exposure through a transparent substrate layer of the relief precursor, embodiments of the invention also cover apparatus where the LED array is used for front exposure.

By performing the controlling such that an irradiation intensity variation in the predetermined surface area is within a certain range, it can be achieved that the thickness variation of the floor is accurately controlled.

Further, compared to existing solutions for back exposure using e.g. UV light tubes, the energy consumption and the cost of embodiments of the invention can be lower by using a LED array. Also, the process can be faster since there is no need for pre-heating, as for UV light tubes. Also, because the subsets of the LED array can be individually activated in function of the size of the relief precursor, the energy consumption for smaller plates will be smaller compared to existing solutions where all the UV light tubes are activated regardless of the size.

According to an exemplary embodiment, the apparatus of FIG. 1 may be used as follows. The LED array 20 is controlled to emit radiation to a photosensitive layer of the relief precursor P, through the substrate layer of the relief precursor, such that the predetermined surface area is radiated simultaneously, wherein the plurality of subsets are controlled individually, and such that an irradiation intensity variation in the predetermined surface area is within a predetermined range.

Before using the apparatus, the apparatus may be calibrated using any one of the following methods. According to a first possible embodiment, the calibration method comprises using the LED array 20 to emit radiation in a predetermined surface area; measuring in a plurality of locations L1, L2, L3, etc. of the predetermined surface area, a value representative for the irradiation intensity, using the at least one sensor 50; determining a control scheme for controlling the plurality of subsets 21 based on the measured values to obtain a desired irradiation pattern in the predetermined surface area. The desired irradiation pattern may be a substantially homogeneous irradiation pattern in order to obtain a floor with a substantially constant thickness, but may also be a pattern with different irradiation zones in order to obtain different floor thicknesses.

The measuring in a plurality of locations L1, L2, L3, etc. may be done by moving at the least one sensor 50 such that the at least one sensor performs measurements in the plurality of locations. For example, the measuring and controlling may comprise:

positioning at least one sensor 50 at a first position in a plane parallel to the plane of LED array, said first position being associated with one or more first neighboring LEDs of the LED array;

measuring the irradiation intensity at a first location L1 associated with the first position of the at least one sensor 50;

positioning the at least one sensor 50 at a further position in said plane, said further position being associated with one or more further neighboring LEDs of the LED array;

measuring the irradiation intensity at a further location L2 associated with the further position of the at least one sensor;

adjusting the irradiation intensity of one or more of the first and/or further neighboring LEDs such that the difference between irradiation intensity in the first location L1 and in the further location L2 is reduced;

The steps above may be repeated for the same locations L1, L2, and/or for other locations L3, etc, until the desired irradiation pattern is achieved.

According to another possible embodiment, the calibration method comprises:

using the LED array 20 to emit radiation in a predetermined area of a photosensitive layer of the relief precursor, such that said predetermined area cures;

removing the uncured portion of the relief precursor;

measuring thickness variations of the cured area;

determining a control scheme for controlling the plurality of subsets based on the measured thickness variations to obtain a desired irradiation pattern in the predetermined area.

FIGS. 3-6 illustrate in detail an exemplary embodiment which uses the same main components as the embodiment of FIG. 1, and those components will not be described again. The apparatus comprises a housing 100 with a lower housing portion 130 comprising the back-exposure means and an upper housing portion 110 comprising the front exposure means. The relief precursor P may be manually or automatically brought onto a carrying structure 10, such that the relief precursor is located between the back-exposure means in the lower housing portion 130 and the front-exposure means in the upper housing portion 110. Optionally, the apparatus may comprise an additional front-exposure means 120 comprising a moveable LED bar. The movable LED bar structure 120 can be moved from right to left and back.

Figure 4:
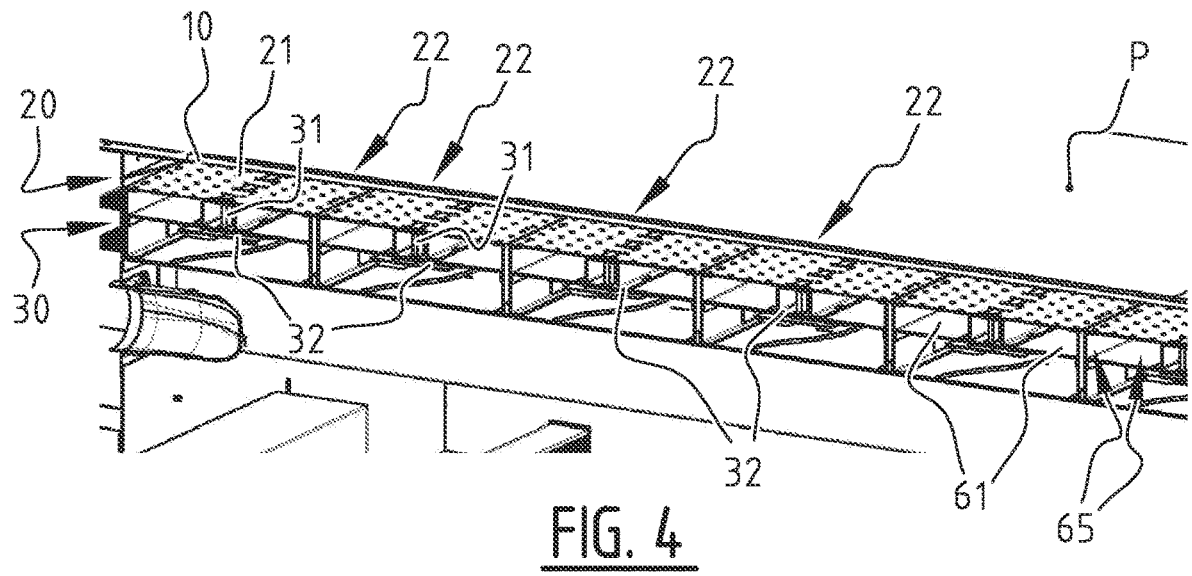
FIG. 4 is a detailed perspective view of the exemplary embodiment of FIG. 3.
Figure 6:
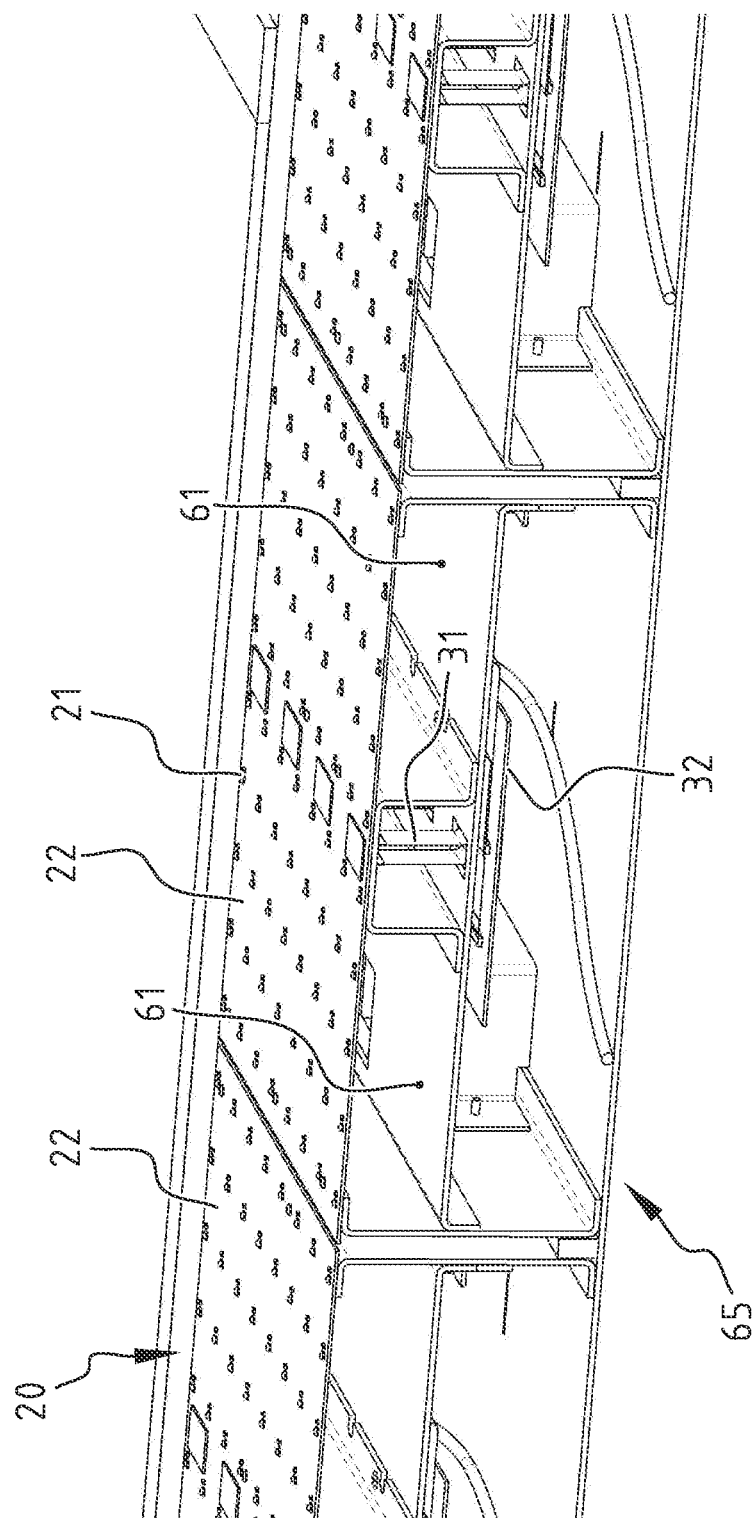
FIG. 6 is a detailed perspective view of the LED and driver PCBs of the exemplary embodiment of FIG. 3.

FIG. 4 illustrates a cross section through the lower housing portion 130. The LED array 20 is arranged in the lower housing portion 130 and comprises a plurality of LED PCBs 22, here 3×6 LED PCBs 22 arranged next to each other in a plane parallel to the glass plate 10 which supports the relief precursor P. FIGS. 4 and 6 further show drive means 30 comprising a plurality of driver PCBs 32 carrying driver circuitry. The driver PCBs 32 are arranged in a plane below the LED PCBs 22. A plurality of cables 31 connect the driver circuitry on a driver PCB 32 to a connector on the LED PCB 22 above, in order to connect the LEDs 21 arranged on the LED PCB 22. The LED PCBs 22 and the driver PCBs 32 are mounted on opposite sides of a support structure 65, preferably made of a thermally conductive material. A cooling means (not shown) may be configured to generate an air flow through channels 61 of the support structure 65 in order to cool the LED PCBs 22 and the associated LEDs 21.

Figure 5:
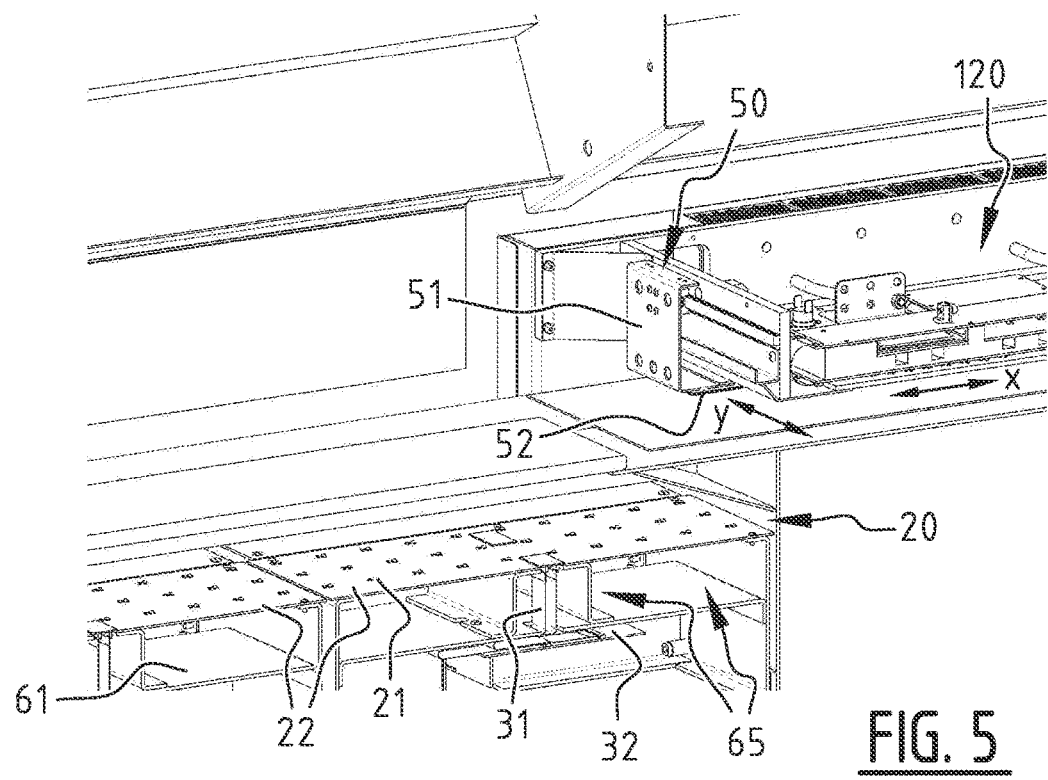
FIG. 5 is a detailed perspective view of the sensor means of the exemplary embodiment of FIG. 3.

FIG. 5 shows in detail the sensor means 50. The sensor means 50 comprise a movable support structure 51 which carries a sensor support plate 52 on which a plurality of sensors, typically UV sensors, e.g. diodes, are mounted (not visible in FIG. 5 as the sensors are mounted on the lower side of sensor support plate 52). The support structure 51 is movable in an X direction and in a Y direction, in a plane parallel to the plane of the LED array 20. Optionally, the support structure 51 may be movably attached to the front-exposure means 120 which is movable in the X direction, wherein the support structure is moveable in the Y direction relative to the front-exposure means 120.

The methods explained above in connection with the previous embodiments can also be performed with the apparatus of FIGS. 3-6.

In non-illustrated embodiments, a post-treatment may be provided to perform a post-treatment on the relief precursor, e.g. washing, drying, post-exposure, heating, cooling, removing of material, etc. Further, in non-illustrated embodiments, a pre-treatment may be provided to perform a pre-treatment on the relief precursor, said pre-treatment being selected from the group comprising: cutting, ablation, exposure to electromagnetic radiation, and combinations thereof.

A relief precursor generally comprises a support layer and at least one photosensitive layer. The support layer may be a flexible metal, a natural or artificial polymer, paper or combinations thereof. Preferably the support layer is a flexible metal or polymer film or sheet. In case of a flexible metal, the support layer could comprise a thin film, a sieve like structure, a mesh like structure, a woven or non-woven structure or a combination thereof. Steel, copper, nickel or aluminium sheets are preferred and may be about 50 to 1000 µm thick. In case of a polymer film, the film is dimensionally stable but bendable and may be made for example from polyalkylenes, polyesters, polyethylene terephthalate, polybutylene terephthalate, polyamides and polycarbonates, polymers reinforced with woven, nonwoven or layered fibres (e.g. glass fibres, Carbon fibres, polymer fibres) or combinations thereof. Preferably polyethylene and polyester foils are used and their thickness may be in the range of about 100 to 300 µm, preferably in the range of 100 to 200 µm.

In addition to the photosensitive layer and the support layer, the relief precursor may comprise one or more further additional layers. For example, the further additional layer may be any one of the following: a direct engravable layer (e.g. by laser), a solvent or water developable layer, a thermally developable layer, a mask layer, a cover layer, a barrier layer, etc. Between the different layers described above one or more adhesion layers may be located which ensure proper adhesion of the different layers.

Whilst the principles of the invention have been set out above in connection with specific embodiments, it is to be understood that this description is merely made by way of example and not as a limitation of the scope of protection which is determined by the appended claims.

The invention claimed is:

1. An apparatus for exposure of a relief precursor (P) which comprises a substrate layer and at least one photosensitive layer, said apparatus comprising:
   a carrying structure for carrying a relief precursor;
   a lower housing portion arranged below the carrying structure and comprising a back exposure unit;
   an upper housing part comprising a front exposure unit arranged above the carrying structure, said front exposure unit comprising a movable LED bar structure;
   said back exposure unit comprising a LED array configured to illuminate a photosensitive layer of the relief precursor carried by the carrying structure, said carrying structure comprising a support structure for supporting the relief precursor, said support structure being at least partially transparent for light generated by the LED array, said LED array being configured to illuminate simultaneously a predetermined surface area of at least 900 cm$^2$, said LED array comprising a plurality of subsets of one or more LEDs, each subset being individually controllable;
   at least one sensor being arranged in the upper housing part so that said at least one sensor and said LED array are arranged on opposite sides of the support structure, said at least one sensor being configured to measure in a plurality of locations of the predetermined surface area illuminated by the LED array, a value representative for the irradiation intensity; said predetermined surface area being a surface area in said upper housing part oriented parallel to the LED array; and
   a control unit to control the plurality of subsets individually based on the values measured by the at least one sensor, and such that an irradiation intensity difference in the predetermined surface area is within a predetermined range.

2. The apparatus of claim 1, wherein the substrate layer is a transparent substrate layer and wherein the LED array is arranged to illuminate the photosensitive layer of the relief precursor through the substrate layer of the relief precursor.

3. The apparatus of claim 1, further comprising
   a moving means comprising a drive configured to move the at least one sensor in a plane parallel to the LED array, in an X-direction and in an Y-direction, in order to perform measurements in the plurality of locations.

4. The apparatus according to claim 3, wherein the number of the plurality of locations is equal to or higher than the number of the plurality of subsets.

5. The apparatus according to claim 1, wherein the LEDs of the LED array are configured to emit electromagnetic radiation with a wavelength in the region of 200 to 2000 nm.

6. The apparatus according to claim 1, wherein the irradiation intensity delivered by the LEDs in the predetermined surface area is in the range of 0.1 to 2000 mW/cm$^2$ for back-exposure and between 30 and 500 mW/cm$^2$ for front-exposure.

7. The apparatus according to claim 1, wherein a distance (ds) between the predetermined surface area (S) and the LED array is at least 35 mm.

8. The apparatus according to claim 1, wherein for any predetermined surface area in a plane parallel to the LED array which is at a distance of the LED array between a first distance and a second distance, the irradiation intensity variation in the predetermined surface area is within the predetermined range, wherein the difference between the second and the first distance is at least 1 mm.

9. The apparatus according to claim 1, wherein the distance between individual LEDs of the LED array is at least 5 mm.

10. The apparatus according to claim 1, further comprising cooling means configured to cool the LED array.

11. The apparatus according to claim 1, further comprising a drive means configured for driving the LED array, by pulse width modulation signals.

12. The apparatus of claim 1, wherein the at least one sensor is arranged on a movable sensor support structure and the moveable sensor support structure is movably attached to the movable LED bar.

13. The apparatus of claim 12, wherein the front-exposure unit is configured so that the movable LED bar is movable in an X direction, wherein the movable sensor support structure is movable in a Y-direction relative to the movable LED bar.

14. A calibration method for calibrating an exposure apparatus comprising a LED array, and a carrying structure comprising a plate for supporting a relief precursor, said plate being at least partially transparent for light generated by the LED array, said method comprising:
   using the LED array to emit radiation in a predetermined surface area; said LED array comprising a plurality of subsets of one or more LEDs, each subset being individually controllable;
   measuring in a plurality of locations of the predetermined surface area, a value representative for the irradiation intensity, using at least one sensor; said at least one sensor being arranged at a first side of the plate and said LED array being arranged at a second opposite side of the plate; said predetermined surface area being a surface area parallel to the LED array; wherein the measuring in a plurality of locations is done by moving at least one sensor in a plane parallel to the LED array, such that said at least one sensor performs measurements in the plurality of locations; and
   determining a control scheme for controlling the plurality of subsets based on the measured values to obtain a desired irradiation pattern in the predetermined surface area.

15. The calibration method of claim 14, wherein the desired irradiation pattern is a substantially homogeneous irradiation pattern.

16. The calibration method of claim 14, wherein the measuring and controlling comprises:
   positioning at least one sensor at a first position in a plane parallel to the plane of LED array, said first position being associated with one or more first neighboring LEDs of the LED array;
   measuring the irradiation intensity at a first location associated with the first position of the at least one sensor;
   positioning the at least one sensor at a further position in said plane, said further position being associated with one or more further neighboring LEDs of the LED array;

measuring the irradiation intensity at a further location associated with the further position of the at least one sensor; and adjusting the irradiation intensity of one or more of the first and/or further neighboring LEDs such that the difference between irradiation intensity in the first location and in the further location is reduced;

wherein the steps above are repeated for the same and/or for other locations.

* * * * *